Feb. 27, 1968 M. BELASCO ET AL 3,371,255
GALLIUM ARSENIDE SEMICONDUCTOR DEVICE AND CONTACT ALLOY THEREFOR
Filed June 9, 1965
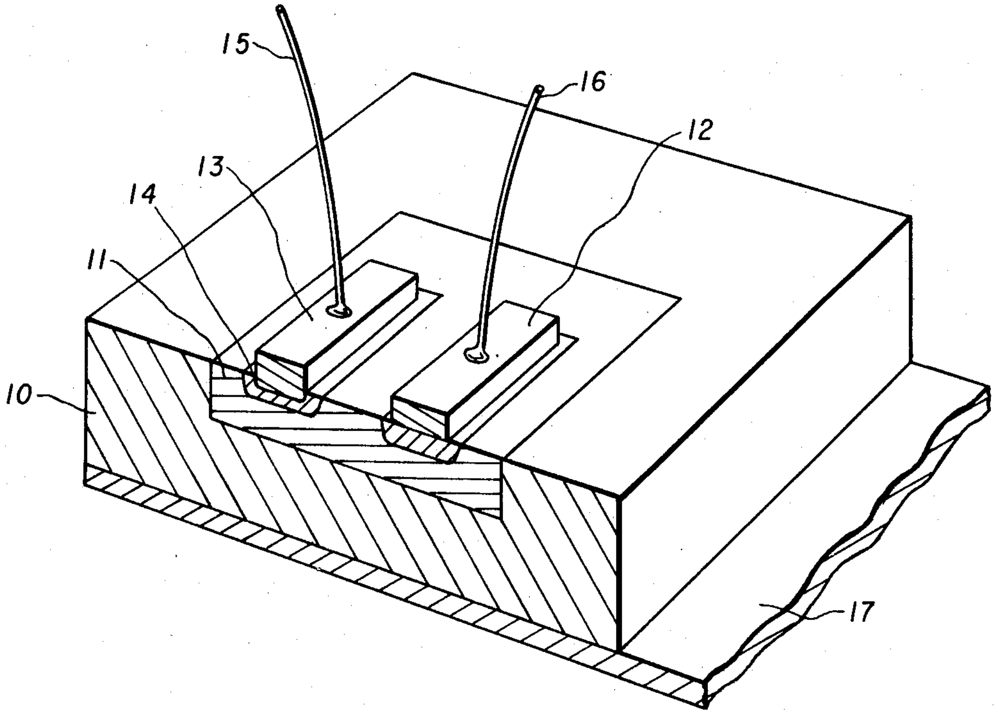
MELVIN BELASCO
BOBBY W. HOWETH
DAVID D. MARTIN
PRICE T. WENDE
INVENTORS
BY John D. Graham
ATTORNEY United States Patent Office 3,371,255

Patented Feb. 27, 1968

3,371,255

GALLIUM ARSENIDE SEMICONDUCTOR DEVICE AND CONTACT ALLOY THEREFOR

Melvin Belasco, Bobby W. Howeth, and David D. Martin, Dallas, and Price T. Wende, Richardson, Tex., assignors to Texas Instruments Incorporated, Dallas, Tex., a corporation of Delaware Filed June 9, 1965, Ser. No. 462,583
7 Claims. (Cl. 317—237)

ABSTRACT OF THE DISCLOSURE

Disclosed is a gallium arsenide transistor and contact alloy, the contact alloy comprising by weight 25–35% gold, 60–70% germanium and 3–10% donor impurity selected from the group consisting of sulfur, tin, selenium and tellurium by weight.

This invention relates to contact materials for semiconductor devices, such as transistors. More particularly it relates to alloys used for the formation of ohmic contacts to N-type materials as well as for the formation of the emitter of an NPN Group IIIa–Va compound transistor.

One of the major advantages of wide bandgap semiconductor materials, such as gallium arsenide, is the capability to function as a semiconductor device at elevated temperatures. For example, it is known that gallium arsenide transistors can operate effectively at temperatures as high as 400° C. Even though gallium arsenide permits high temperature operation, this is no advantage if the electrodes or contact materials will not withstand such high temperatures. In other words, even though the body of the semiconductor device will function properly as a semiconductor device at elevated temperatures, the materials which form electrical contacts to the body will not unless they, too, are capable of operating and performing the desired contact functions at the same elevated temperatures. Furthermore, the step of attaching electrodes to the material must be compatible with other steps in the fabrication of the device, and in the case of an emitter contact, the contact alloy must contain a sufficient amount of donor impurity to over-compensate the acceptor impurities at the surface of the base region and form an N-type regrowth or diffused region.

It is therefore an object of this invention to provide an emitter contact alloy which will not impose limitations on gallium arsenide devices for high temperature operation. Another object is to provide contacts for Group IIIa–Va compound semiconductor devices which permit high temperature operation, but yet may be fabricated by preferred techniques such as evaporation. Another object is to provide an emitter alloy which may be deposited by evaporation upon a semiconductor surface in any desired geometry or configuration and which, when alloyed to a P-type semiconductor surface, will produce an N-type region which operates effectively as an emitter and emitter contact at temperatures as high as 350° C. Yet a further object is to provide an alloy which will form a high temperature stable ohmic connection to N-type Group IIIa–Va compound semiconductor materials.

In accordance with this invention, a novel metal alloy, specifically gold, germanium, and a donor impurity such as tin, sulfur, selenium or tellurium is used to provide an emitter contact to P-type galium arsenide, or an ohmic contact to N-type material. This alloy, preferably about 30% gold, 65% germanium, and 5% donor impurity by weight can withstand operating temperatures virtually as high as the upper limit of a gallium arsenide transistor itself. The alloy contact of this invention can be applied by conventional vacuum evaporation using masking to provide geometrical control. Another advantage of the invention is that the above-described alloy can be evaporated in any desired configuration through conventional evaporation masks, either in the alloyed form or by the separate evaporation of each of the constituents onto the exposed surface of a semiconductor substrate.

These and other objects and features of the invention will become more readily understood in the following detailed description taken in conjunction with the sole figure of the drawing, which is a perspective view partially in section of a planar diffused-base gallium arsenide transistor utilizing the novel emitter contact alloy of this invention.

The transistor illustrated in the figure comprises a wafer of N-type gallium arsenide 10 having a planar diffused P-type region 11 formed therein. Diffused region 11 may be formed by conventional planar diffusion techniques wherein a P-type impurity such as manganese, zinc, cadmium, or magnesium is diffused into an area of the surface of the wafer 10 exposed through a window in a silicon oxide mask. Base stripe 12 and emitter stripe 13 are then evaporated onto the surface of the P-type region and, when the wafer is heated to approximately 950° C., the base stripe 12 alloys with the P-type layer 11 to form an ohmic contact therewith. During this alloying step, part of the donor impurity diffuses from the emitter stripe 13 to form an N-type diffused region 14 and the emitter stripe 13 alloys with the diffused region 14 to form an ohmic contact therewith. Suitable electrodes such as gold wires 15 and 16 are attached to the evaporated contact stripes. Tab 17 is ohmically attached to the wafer 10 to provide a collector contact electrode. Thus it will be understood that in the transistor shown and described, wafer 10 constitutes the collector, P-type region 11 constitutes the base, and the N-type diffused region 14 forms the emitter.

With the exception of the emitter alloy, the above described gallium arsenide transistor is representative of known compound semiconductor devices. Hence the conventional processes for making such devices, which include the necessary steps of etching, cleaning and diffusion of the base region have been omitted as they form no part of this invention.

The emitter contact stripe 13, in accordance with this invention, is composed of an alloy of gold, germanium and a donor impurity such as tin, sulfur, selenium or tellurium, preferably about 30% gold, 65% germanium, and 5% donor impurity by weight. The alloy may be formed by mixing weighed amounts of the constituents and vacuum evaporating the mixture to form evaporated contacts as described above. Since each of the constituents have dissimilar vapor pressures, evaporation of the mixture usually results in a distillation whereby the higher vapor pressure constituent evaporates first, followed in order by lower vapor pressure constituents. Consequently the alloy is formed by the individual evaporation of each of the constituents in measured amounts onto a semiconductor surface exposed through a window in a suitable evaporation mask. Alternatively, the order of evaporation of the constituents may be varied by individually evaporating measured amounts of each of the constituents in any desired order. However, the order of evaporation of the individual constituents is not critical since the alloy is formed by heating the substrate wafer and the evaporated constituents after all the constituents of the alloy have been deposited on the substrate.

In accordance with the invention, a wafer of N-type gallium arsenide 10 having a diffused P-type layer 11 formed therein was placed on a metal evaporation mask having parallel windows of 1.5 x 5.0 mils therein. Each of the windows exposed part of the surface of the P-type layer 11. An alloy of gold, germanium, and zinc was evaporated onto the surface exposed through one of the windows to form the ohmic base contact 12. The emitter alloy 13 was formed on the surface of the gallium arsenide exposed through the other window by evaporating a mixture comprising 30% gold, 65% germanium, and 5% surlfur by weight onto the surface exposed through the other window. The metal mask was then removed and a protective coating of about 3,000 A. units of silicon oxide deposited over the surface of the gallium arsenide wafer and the contact stripes thereon. The wafer was then placed in an evacuated quartz ampoule and heated at 950° C. for 30 minutes. Upon removal from the furnace, the silicon oxide coating was removed with hydrofluoric acid (HF) and emitter and base lead wires 15 and 16 were attached to the alloyed stripes.

Transistors produced as described above were found to operate effectively as high as 350° C. with no deleterious effects on the emitter contact alloy.

The composition of the emitter alloy is not critical. Suitable emitter contact alloys have been formed wherein the amount of gold was varied from 25–35%, the amount of germanium varied from 60–70%, and the amount of sulfur varied from 3–10% by weight. Furthermore, the alloying temperature of the alloy is not critical and may be satisfactorily alloyed to form an N-type emitter region at any temperature between about 700° C. to about 1000° C. Thus the alloy is advantageously compatible with conventional methods for forming evaporated stripe geometry transistors.

Although the preferred embodiment utilizes an alloy of gold, germanium, and sulfur, other impurities such as tin, selenium or tellurium may be substituted for sulfur in the above example. Since the donor impurity only constitutes about 3% to about 10% of the alloy by weight, substitution of other donor impurities does not substantially affect the melting point of the alloy. Furthermore, since the diffusion constants of the donor impurities are characteristic of the impurity element, the donor impurity constituent in the alloy may be advantageously selected to provide an emitter diffusion step which is compatible with other steps in fabricating a device, yet provide emitter contact alloys with similar electrical characteristics.

It will be understood that while the invention has been specifically described in terms of an alloy for making emitters in NPN gallium arsenide transistors, the alloy may also be used to form ohmic contacts to N-type semiconductor material, for example, alloys of about 30% gold, 65% germanium and 5% tin have been advantageously used as a backing or preform for forming ohmic connections to N-type collector of a gallium arsenide transistor. When used for this purpose the alloy advantageously wets the semiconductor surface to form a uniform alloy and the donor constituent diffuses into the N-type material, thus assuring a low resistance contact. Furthermore, the alloy forms a rigid mechanical bond to conventional electrode materials such as gold and platinum.

While a planar diffused-base transistor is described above as an example of a device wherein the improved emitter contact material of this invention has particular utility, other semiconductor devices such as diodes, thermistors and integrated circuits, as well as mesa type transistors, may well utilize the invention.

Other advantages and features of the invention will become readily apparent to those skilled in the art. It is to be understood that the form of the invention herewith shown and described is to be taken as a preferred example of the same and that various changes may be resorted to without departing from the spirit and scope of the invention as defined by the appended claims.

What is claimed is:

1. A gallium arsenide device including a P-type conductivity region and a contact material alloyed with a portion of said P-type conductivity region, said contact material comprising 25–35% gold, 60–70% germanium, and 3–10% donor impurity selected from the group consisting of sulfur, selenium, tellurium and tin, by weight.

2. A gallium arsenide device as in claim 1 wherein said contact material comprises about 30% gold, about 65% germanium, and about 5% of said donor impurity, by weight.

3. A gallium arsenide device as in claim 1 wherein said donor impurity is sulfur.

4. In combination with a gallium arsenide device including a N-type conductivity region, an alloy for forming ohmic contact to said N-type conductivity region, said alloy comprising 25–35% gold, 60–70% germanium, and 3–10% donor impurity selected from the group consisting of sulfur, tin, selenium and tellurium, by weight.

5. The combination of claim 4 wherein said alloy comprises about 30% gold by weight, about 65% germanium by weight, and about 5% donor impurity by weight.

6. A gallium arsenide transistor comprising a body of gallium arsenide having a region of P-type conductivity and a region of N-type conductivity, an ohmic electrode attached to said region of P-type conductivity and a rectifying electrode alloyed to said region of P-type conductivity, said rectifying electrode comprising an alloy of 25–35% gold, 60–70% germanium, and 3–10% donor impurity selected from the group consisting of sulfur, tin, selenium and tellurium, by weight.

7. A gallium arsenide transistor as in claim 6 wherein said donor impurity is sulfur.

References Cited

UNITED STATES PATENTS

| | | | |
|---|---|---|---|
| 3,025,439 | 3/1962 | Anderson | 317—234 |
| 3,159,462 | 12/1964 | Kadelburg | 317—234 |
| 3,245,848 | 4/1966 | De Vaux et al. | 317—237 X |
| 3,255,056 | 6/1966 | Flatley et al. | 317—237 X |
| 3,313,663 | 4/1967 | Yeh et al. | 317—237 X |
| 3,324,361 | 6/1967 | Belasco et al. | 317—237 |

JAMES D. KALLAM, *Primary Examiner.*

C. N. LOVELL, *Examiner.*